(12) United States Patent
Kakegawa (10) Patent No.: US 8,026,502 B2
(45) Date of Patent: Sep. 27, 2011

(54) PHASE-CHANGE NONVOLATILE MEMORY AND MANUFACTURING METHOD THEREFOR

(75) Inventor: Tomoyasu Kakegawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 430 days.

(21) Appl. No.: 12/292,433

(22) Filed: Nov. 19, 2008

(65) Prior Publication Data

US 2009/0134379 A1    May 28, 2009

(30) Foreign Application Priority Data

Nov. 26, 2007    (JP) ................. P2007-304332

(51) Int. Cl.
*H01L 45/00*    (2006.01)
(52) U.S. Cl. .................. 257/3; 257/2; 365/148
(58) Field of Classification Search .......... 257/2, 3, 257/E45.002; 365/148
See application file for complete search history.

(56) References Cited

U.S. PATENT DOCUMENTS 7,642,622 B2 *  1/2010  Yi et al. .................. 257/613
7,879,645 B2 *  2/2011  Lung et al. .............. 438/102
2006/0118913 A1  6/2006  Yi et al.
2007/0063180 A1 *  3/2007  Asano et al. ................ 257/3
2010/0019215 A1 *  1/2010  Lung et al. .................. 257/2

FOREIGN PATENT DOCUMENTS

JP    2006-165560    6/2006
JP    2007-73779    3/2007

* cited by examiner

*Primary Examiner* — Leonardo Andujar
*Assistant Examiner* — Jordan Klein
(74) *Attorney, Agent, or Firm* — McGinn IP Law Group, PLLC (57) ABSTRACT

A phase-change nonvolatile memory (PRAM) is constituted of a semiconductor substrate, a lower electrode, a first interlayer insulating film having a first hole, an impurity diffusion layer embedded in the first hole, a second interlayer insulating film having a second hole whose diameter is smaller than the diameter of the first hole, a phase-change recording layer, and an upper electrode. The impurity diffusion layer is constituted of two semiconductor layers having different conductivity types, wherein one semiconductor layer is constituted of a base portion and a projecting portion having a heating spot in contact with the phase-change recording layer, while the other semiconductor layer is formed to surround the projecting portion. A depletion layer is formed in proximity to the junction surface so as to reduce the diameter of the heating spot, thus reducing the current value Ireset for writing data in to the phase-change recording layer.

18 Claims, 9 Drawing Sheets

(RELATED ART)

FIG. 10

(RELATED ART)

FIG. 11

PHASE-CHANGE NONVOLATILE MEMORY AND MANUFACTURING METHOD THEREFOR

BACKGROUND OF THE INVENTION

1. Field of the Invention

The present invention relates to phase-change nonvolatile memories and manufacturing methods therefor.

The present application claims priority on Japanese Patent Application No. 2007-304332, the content of which is incorporated herein by reference.

2. Description of Related Art

As next-generation semiconductor memories, various types of semiconductor memories have been developed to provide large scales of storages with various electronic devices. For example, it is possible to name ferromagnetic memory (e.g. FeRAM), magnetoresistive memory (e.g. MRAM), resistive memory (e.g. ReRAM), and phase-change memory (e.g. PRAM).

The phase-change memory (PRAM) is the semiconductor memory that stores data using phase-change materials. A current is forced to flow into a heater plug, which is formed below a phase-change recording layer, so as to cause heat at a contact interface between them, wherein phase-change materials forming the phase-change recording layer are changed from a crystallized state to a non-crystallized state or from a non-crystallized state to a crystallized state. Since phase-change materials have different resistances between the crystallized state and the non-crystallized state, the phase-change memory can store data therein.

A current value which is necessary to cause a phase change from the crystallized state to the non-crystallized state is referred to as "Ireset". As Ireset becomes smaller, it is possible to reduce spot diameters causing the phase change in the phase-change recording layer, whereby it is possible to achieve large scale storage. For the purpose of reducing current consumption, it is preferable that Ireset becomes smaller.

Various examples of phase-change memories and nonvolatile memories are disclosed in various documents such as Patent Documents 1 and 2.

Patent Document 1: Japanese Unexamined Patent Application Publication No. 2007-73779

Patent Document 2: Japanese Unexamined Patent Application Publication No. 2006-165560

Patent Document 1 teaches an example of the phase-change nonvolatile memory (PRAM).

Figure 9:
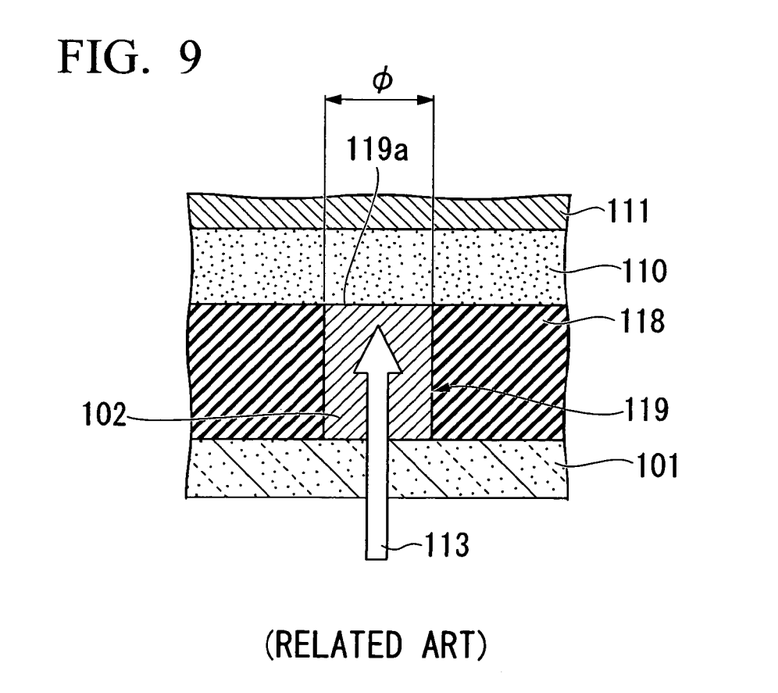
FIG. 9 is a cross-sectional view of one phase-change nonvolatile memory in which a heater plug embedded in a hole has a contact diameter $\phi$ in contact with a phase-change recording layer.

FIG. 9 shows the constitution of the phase-change nonvolatile memory (PRAM) in which a heater plug 102 is embedded in a hole 119 (having a contact diameter $\phi$) running through an interlayer insulating layer 118, wherein a phase-change recording layer 110 formed on the interlayer insulating layer 118 is heated at a contact interface 119a (which is positioned in contact with the hole 119 having the contact diameter $\phi$), thus causing a phase change on a prescribed part of the phase-change recording layer 110.

Since the current value Ireset is proportional to a contact area, i.e. $\pi \times (\phi/2)^2$, between the heater plug 102 and the phase-change recording layer 110, it is necessary to reduce the contact area in order to reduce Ireset; that is, it is necessary to reduce the contact diameter $\phi$.

The contact diameter $\phi$ of the hole 119 is limited by the process limit due to the formation of the hole 119 by way of the lithography, whereby the hole 119 cannot be reduced in size beyond the process limit. The process limit defines the contact area as well as the current value Ireset. Due to the present process limit, the contact diameter $\phi$ may be reduced into the range from approximately 100 mm to 160 nm.

Patent Document 2 teaches another example of the phase-change nonvolatile memory (PRAM) in which the contact diameter $\phi$ is further reduced.

Figure 10:
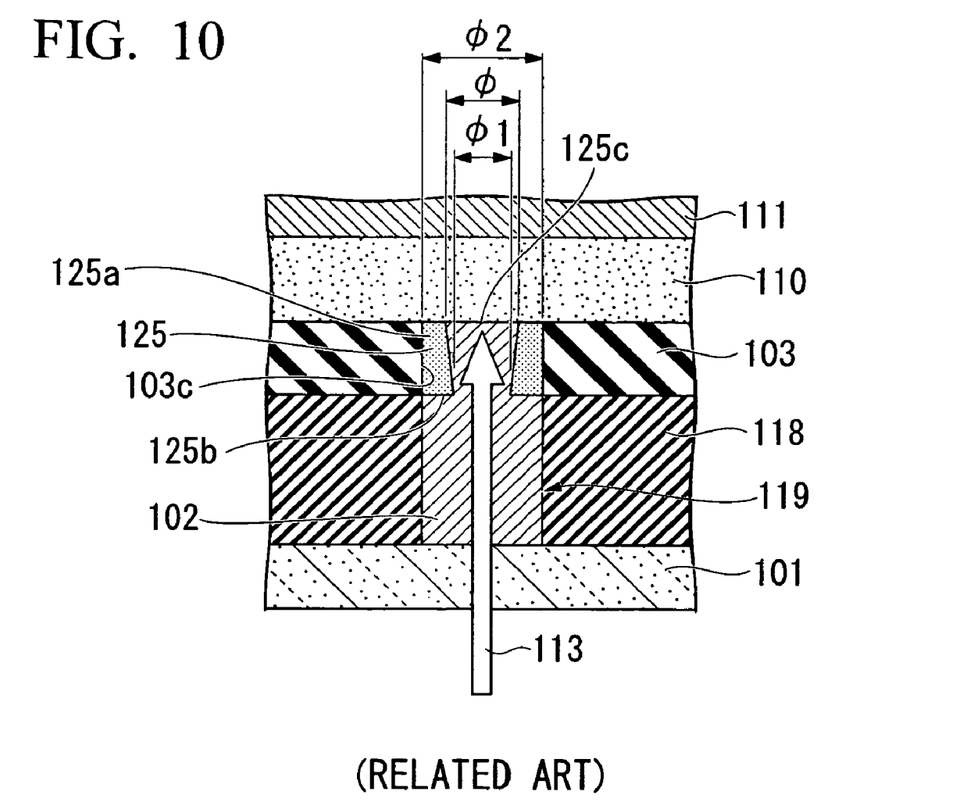
FIG. 10 is a cross-sectional view of another phase-change nonvolatile memory in which the contact diameter $\phi$ is reduced by way of a side wall formed in the upper portion of the hole embedding the heater plug.

FIG. 10 shows the constitution of the phase-change nonvolatile memory, in which a side wall 125 is formed in an upper portion 103c of the hole 119. An interior surface 125c of the side wall 125 has an inclination 125c so that a distal end 125a of the side wall 125 becomes thinner than a base 125b of the side wall 125 in thickness. Using $\phi1$ denoting the diameter at the base 125b of the side wall 125, $\phi$ denoting the diameter at the distal end 125a of the side wall 125, and $\phi2$ denoting the original diameter of the hole 119, the upper portion 103c of the hole 119 is designed such that diameter $\phi1$ at the base 125b of the hole 119 becomes the smallest; hence, $\phi1<\phi<\phi2$. Since the diameter $\phi$ (corresponding to the contact diameter between the heater plug 102 and the phase-change recording layer 110) is smaller than the original diameter $\phi2$, it is possible to reduce the current value Ireset to be smaller than the foregoing current value defined by the original diameter $\phi2$.

Even when the side wall 125 is formed in the upper portion 103c of the hole 119, there still remains the process limit in reducing the contact diameter $\phi$ between the heater plug 102 and the phase-change recording layer 110. When the side wall 125 becomes thicker, a micro-loading effect may apparently appear so as to make it difficult to perform "etch back" in the formation of the side wall 125, which may deteriorate the productivity due to defectiveness. In the case of the hole 119 having the side wall 125, the present process limit may define the contact diameter $\phi$ to approximately 30 nm.

Since the foregoing phase-change nonvolatile memory (PRAM) still suffers from the process limit in reducing the contact diameter $\phi$, the present inventor has recognized that it is difficult to reduce the current value Irest to a desired value.

SUMMARY

The invention seeks to solve the above problem, or to improve upon the problems at least in part.

In one embodiment, there is provided a phase-change nonvolatile memory that includes a semiconductor substrate, a lower electrode, a first interlayer insulating film having a first hole, an impurity diffusion layer embedded in the first hole and constituted of a first semiconductor layer and a second semiconductor layer having different conductivity types, a second interlayer insulating film having a second hole, a phase-change recording layer, and an upper electrode formed on the phase-change recording layer.

The first semiconductor layer is constituted of a base portion which is formed inside the first hole and a projecting portion which projects from the base portion so that a heating spot thereof comes in contact with the phase-change recording layer in the second hole. The second semiconductor layer is formed to surround the projecting portion. In addition, a depletion layer is formed in proximity to the junction surface formed between the first semiconductor layer and the second semiconductor layer so as to reduce the diameter of the heating spot. Thus, the heating spot heats the phase-change recording layer in response to a current flowing between the impurity diffusion layer and the phase-change recording layer.

The manufacturing method of the phase-change nonvolatile memory is realized by way of a semiconductor forming process, a lower electrode forming process, a first hole forming process for forming the first hole running through the first interlayer insulating film, an impurity diffusion layer forming process for forming the impurity diffusion layer constituted of the first and second semiconductor layers, a second hole forming process for forming the second hole running through the second interlayer insulating film, a conductivity type changing process for changing the conductivity type with respect to a part of the second semiconductor layer, a phase-change recording layer forming process, and an upper electrode forming process.

The phase-change nonvolatile memory of the present invention can reduce the current value Ireset for writing data into the phase-change recording layer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

In general, memory cells included in the foregoing phase-change nonvolatile memory (PRAM) are constituted of combinations of MOS (Metal Oxide Semiconductor) memories (serving as switching elements) and storage elements including phase-change materials. Since the detailed constitution and manufacturing method of MOS transistors are well known, the explanation thereof is omitted in the following description.

Hence, the following description will be given mainly with respect to storage elements by way of the following embodiments, which are illustrative and not restrictive and which can be modified in a variety of ways without departing from the scope of the invention.

1. FIRST EMBODIMENT

Figure 1:
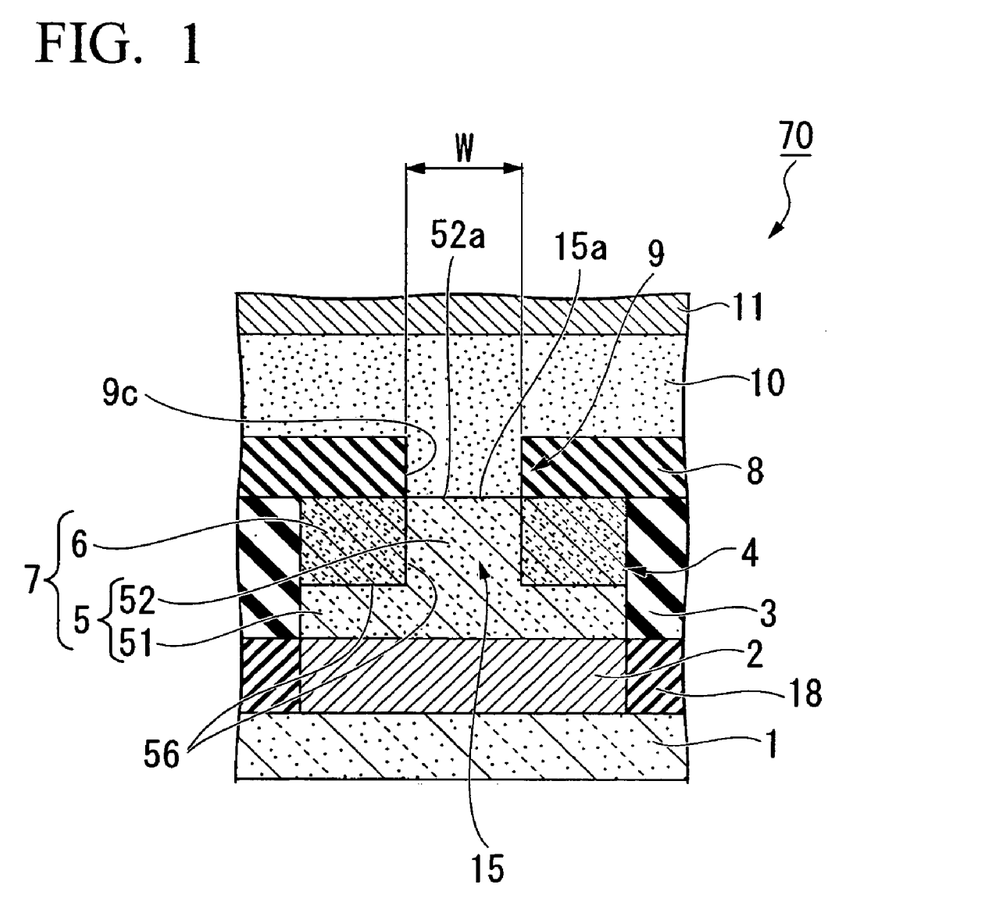
FIG. 1 is a cross-sectional view showing the constitution of a phase-change nonvolatile memory in accordance with a first embodiment of the present invention.
Figure 2A:
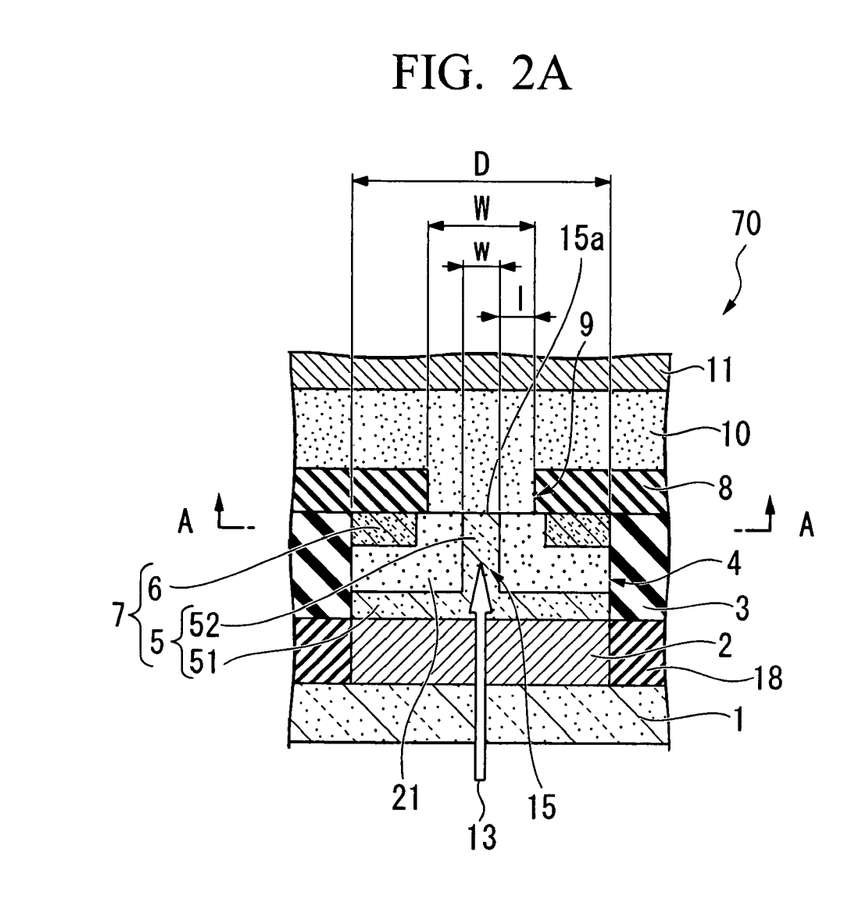
FIG. 2A is a cross-sectional view showing the constitution of the phase-change nonvolatile memory including a depletion layer.
Figure 2B:
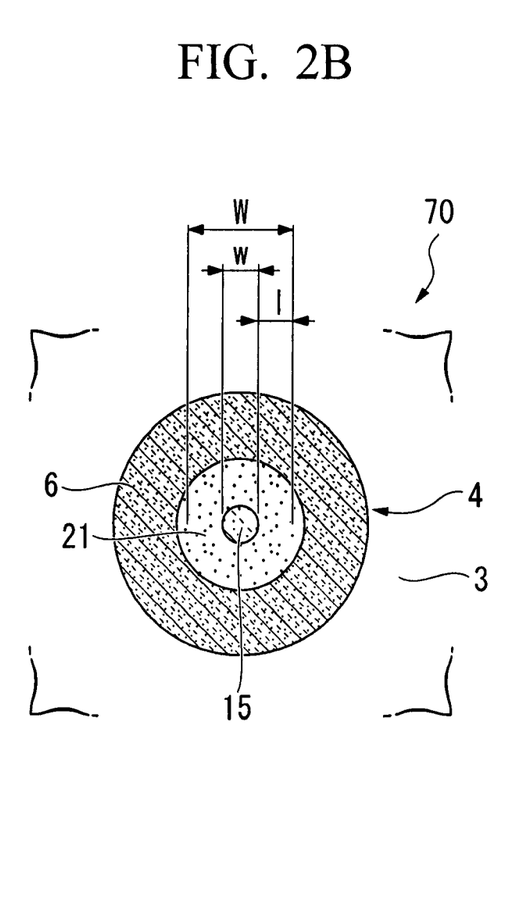
FIG. 2B is a horizontal sectional view taken along line A-A in FIG. 2A.

A phase-change nonvolatile memory (PRAM) 70 according to a first embodiment of the present invention will be described with reference to FIG. 1 and FIGS. 2A and 2B, wherein FIG. 1 is an illustration not including a depletion layer, and FIGS. 2A and 2B are illustrations including a depletion layer.

Referring to FIG. 1, the phase-change nonvolatile memory 70 of the first embodiment is constituted of a lower electrode 2 formed on a semiconductor substrate 1, a first interlayer insulating film 3 which is formed to cover the semiconductor substrate 1 and the lower electrode 2, a first hole 4 which runs through the first interlayer insulating film 3, an impurity diffusion layer 7 embedded in the first hole 4, a second interlayer insulating film 8 which is formed to cover the first interlayer insulating film 3 and the impurity diffusion layer 7, a second hole 9 which runs through the second interlayer insulating film 8, a phase-change recording layer 10 which covers the second interlayer insulating film 8 and which is partially embedded in the second hole 9, an upper electrode 11 which is formed on the phase-change recording layer 10, and a current applying device (not shown) for applying a current between the lower electrode 2 and the upper electrode 11.

Switching elements such as MOS transistors are formed on the semiconductor substrate 1, wherein source and drain regions of MOS transistors are formed in the semiconductor substrate 1 and are connected to the lower electrode 2 via contact plugs which are not shown in FIG. 1.

The impurity diffusion layer 7 is constituted of two semiconductor layers having different conductivity types, namely a first semiconductor layer 5 and a second semiconductor layer 6, which join each other with a junction surface 56 therebetween.

The first semiconductor layer 5 is constituted of a base portion 51 which covers the lower electrode 2 exposed in the first hole 4, and a projecting portion 52 which projects upwardly from the base portion 51 so that an upper surface 52a thereof comes in contact with the phase-change recording layer 10. A heating spot 15a is formed on the upper surface 52a of the projecting portion 52.

The projecting portion 52 of the first semiconductor layer 5 serves as a heater plug 15 which allows a current to flow therethrough so as to heat the phase-change recording layer 10. The heater plug 15 has the heating spot 15a for applying a current so as to heat the phase-change recording layer 10, thus writing data to the phase-change recording layer 10. The diameter of the heating spot 15a is identical to the diameter of the second hole 9.

The second semiconductor layer 6 is formed to surround the projecting portion 52 of the first semiconductor layer 5, wherein the junction surface 56 is formed between the first semiconductor layer 5 and the second semiconductor layer 6. The junction surface 56 is vertically elongated toward the lower electrode 2 along an interior surface 9c of the second hole 9; it is then bent at the intermediate position in the impurity diffusion layer; and then, it is horizontally elongated in parallel with a surface 1a of the semiconductor substrate 1.

As the material of the impurity diffusion layer 7, it is possible to use impurity-diffused N-type and P-type semiconductors. Specifically, impurities such as phosphorus are diffused into a silicon layer composed of an N-type semiconductor, which is formed by way of epitaxial growth. Alternatively, impurities such as boron are diffused into a silicon layer composed of a P-type semiconductor, which is formed by way of epitaxial growth. These materials have relatively low thermal conductivities in comparison with the lower electrode 2; this reduces a heat-sink effect. By changing densities of impurities diffused in semiconductors, it is possible to easily control electric resistances.

As the material of the phase-change recording layer 10, it is preferable to use the chalcogenide material such as GeSbTe. This material can cause and retain stable phase changes. The chalcogenide material is an alloy including at least one of prescribed elements such as germanium (Ge), antimony (Sb), tellurium (Te), indium (In), and selenium (Se). For example, it is possible to list binary compounds such as GaSb, InSb, InSe, $Sb_2Te_3$, and GeTe, ternary compounds such as $Ge_2Sb_2Te_5$, InSbTe, GaSeTe (GST), $SnSb_2Te_4$, and InSbGe, and quarternary compounds such as AgInSbTe, (GeSn)SbTe, GeSb(SeTe), and $Te_{81}Ge_{15}Sb_2S_2$.

Phase-change materials including chalcogenide materials can have any phases such as amorphous phases (or non-crystal phases) and crystal phases, wherein they hare relatively high resistance in amorphous phases but relatively low resistances in crystal phases. Phase-change materials are not necessarily limited to chalcogenide materials; hence, it is possible to use any types of materials whose resistances are varied when heated by currents applied thereto.

As the material of the lower electrode 2, it is possible to use metal silicide such as tungsten (W) and WSi, metal nitride such as TiN, and nitride of metal silicide, for example. The material of the lower electrode 2 is not necessarily limited to the above materials; hence, it is possible to use other materials such as TiAlN, TiSiN, and TiCN.

The upper electrode 11 is coupled with the lower electrode 2. As the material of the upper electrode 11, it is preferable to use materials having low thermal conductivities (which may hardly dissipate heat caused by electrification). Specifically, it is possible to use metal nitrides and other materials such as TiAlN, TiSiN, and TiCN.

As the materials for use in the first interlayer insulating film 3 and the second interlayer insulating film 8, it is possible to use silicon oxide ($SiO_2$), for example.

Since the impurity diffusion layer 7 is constituted of the semiconductor layers 51 and 52 having different conductivity types, the junction surface 56 forms a PN junction, and a depletion layer 21 is formed in proximity to the junction surface 56.

FIGS. 2A and 2B show the phase-change nonvolatile memory 70 including the depletion layer 21, wherein FIG. 2A is a cross-sectional view, and FIG. 2B is a horizontal sectional view taken along line A-A in FIG. 2A.

In the phase-change nonvolatile memory 70 shown in FIG. 2A, the depletion layer 21 is formed in proximity to the junction surface 56 shown in FIG. 1. That is, the depletion layer 21 is formed in contact with the projecting portion 52 of the first semiconductor layer 5 so as to form the heater plug 15 having a small diameter.

The cross section of the depletion layer 21 has an L-shape or a reverse L-shape as shown in FIG. 2A. The depletion layer 21 is formed to partially cut into the first semiconductor layer 5 and the second semiconductor layer 6 from the junction surface 56, wherein the depletion layer 21 is broadened with a width 1 in the first semiconductor layer 5 from the junction surface 56. That is, the depletion layer 21 is broadened in the first semiconductor layer 5 so as to reduce a diameter W of the second hole 9 by the width 1 in both sides, thus forming the heating spot 15a having a diameter w. Hence, the diameter w of the heating spot 15a is given by equation (1).

$$w = W - 2 \times 1 \qquad (1)$$

In the above, W designates the width or diameter of the second hole 9, while 1 designates the width of the depletion layer 21 within the first semiconductor layer 5 in plan view.

Since the width W is defined by the process limit, it is possible to control the width W by controlling process conditions. It is possible to control the width 1 of the depletion layer 21 in the first semiconductor layer 5 by controlling the density of impurities doped into the first semiconductor layer 5 and the doping condition in manufacturing.

It is possible to control the diameter (i.e. the width w) of the heating spot 15a by controlling the sizes of the second hole 9 and the depletion layer 21.

When a current 13 is applied in the direction from the lower electrode 2 to the upper electrode 11 via the heater plug 15, the heating spot 15a heats the phase-change recording layer 10 with the current 13, thus writing data into the phase-change recording layer 10.

The area of the heating spot 15a is proportional to the current value Ireset which flows through the heater plug 15 so as to heat the phase-change recording layer 10; hence, the diameter of the heating spot 15a proportionally depends upon the current value Ireset; in other words, it is possible to reduce the current value Ireset. That is, it is possible to reduce the current value Ireset (for writing data into the phase-change recording layer 10) when the diameter of the heating spot 15a decreases to be smaller than the diameter W of the second hole 9 defined by the process limit.

As a result, it is possible to increase the scale of storage of the phase-change nonvolatile memory 70 while reducing the power consumption.

As shown in FIG. 2B, the heater plug 15, the depletion layer 21, and the second semiconductor layer 6 are arranged in a concentric manner in plan view, wherein the second semiconductor layer 6 is surrounded by the first interlayer insulating layer 3. The cross section of the heater plug 15 is shaped identical to that of the heating spot 15a; hence, the diameter of the heater plug 15 is identical to the diameter of the heating spot 15a.

It is preferable that the diameter of the second hole 9 be smaller than the diameter of the first hole 4, and the second hole 9 be positioned inside the first hole 4 in plan view.

Since the depletion layer 21 is formed to surround the heater plug 15 so as to reduce the diameter of the heat plug 15 as shown in FIG. 2B, it is possible to reduce the diameter of the heating spot 15a.

The impurity diffusion layer 7 is constituted of the first semiconductor layer 5 and the second semiconductor layer 6 and is composed of a prescribed material whose thermal conductivity is lower than that of the foregoing heater plug made of a metal used in the foregoing phase-change nonvolatile memory. This reduces the heatsink effect while improving the heating efficiency (or phase-change efficiency) of the phase-change recording layer 10. In other words, this reduces the current value Ireset (which is used to heat the phase-change recording layer 10, thus causing a phase change), thus performing phase-change reloading of data efficiently.

Since the phase-change nonvolatile memory 70 is designed such that the depletion layer 21 is formed in the impurity diffusion layer 70 so as to reduce the diameter w of the heating spot 15a to be smaller than the diameter W of the second hole 9 (which is defined by the lithography limit and the process limit due to the micro-loading effect) (where w<W), it is possible to reduce the current value Ireset which is necessary to cause a phase change in the phase-change recording layer 10.

The phase-change nonvolatile memory 70 of the first embodiment is designed to reduce the current value Ireset (which is necessary to cause a phase change in the phase-change recording layer 10); hence, it can achieve the large scale of storage. In addition, it is possible to produce semiconductor devices using the phase-change nonvolatile memory 70 serving as a large-scale memory by reducing the current value Ireset.

As the material of the heater plug 15, the first embodiment uses an impurities-doped semiconductor material whose thermal conductivity is higher than that of metals; hence, it is possible to reduce the heatsink effect, thus further reducing the current value Ireset. Thus, it is possible to produce semiconductor devices using the phase-change nonvolatile memory 70 in which the phase-change recording layer 10 is improved in terms of the heating efficiency (or phase-change efficiency).

2. SECOND EMBODIMENT

Figure 3A:
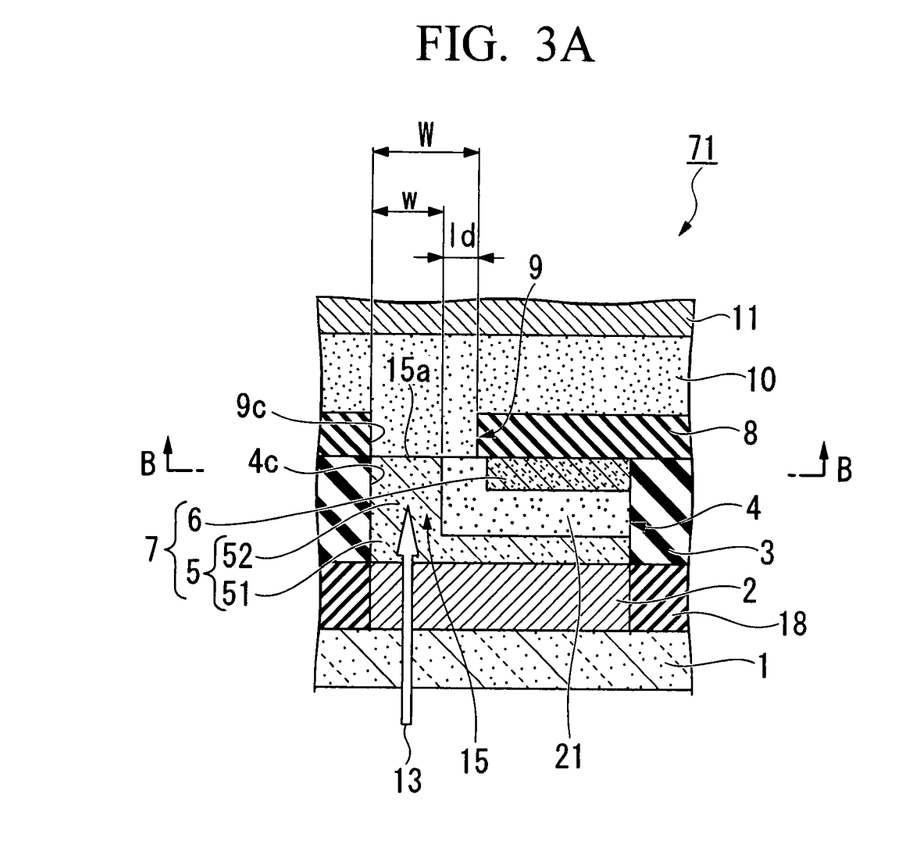
FIG. 3A is a cross-sectional view showing the constitution of a phase-change nonvolatile memory in accordance with a second embodiment of the present invention.
Figure 3B:
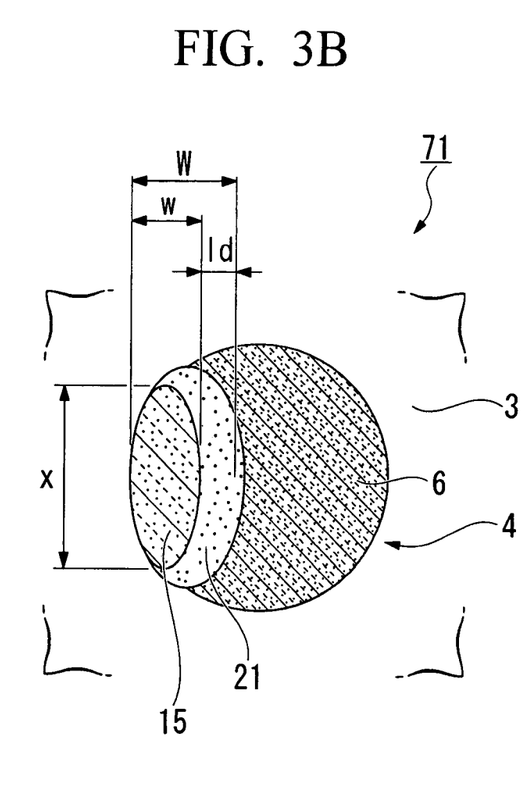
FIG. 3B is a horizontal sectional view taken along line B-B in FIG. 3A.

Next, a phase-change nonvolatile memory 71 according to a second embodiment of the present invention will be described with reference to FIGS. 3A and 3B, wherein parts identical to those shown in FIG. 1 and FIGS. 2A and 2B are designated by the same reference numerals. FIG. 3A shows the constitution of the non-volatile memory 71 including the depletion layer 21, and FIG. 3B is a horizontal sectional view taken along line B-B.

In the phase-change nonvolatile memory 71 of FIG. 3A, the second hole 9 is arranged in connection with the first hole 4 in such a way that a part of an interior surface 9c of the second hole 9 comes in contact with an interior surface 4c of the first hole 4. Herein, a PN junction is formed on one side of the phase-change nonvolatile memory 71, in which the cross section of the depletion layer 21 is formed in an L-shape.

The depletion layer 21 is formed to partially cut into the first semiconductor layer 5 and the second semiconductor layer 6 from the junction surface 56. Specifically, the depletion layer 21 is broadened in the first semiconductor layer 5 with a width 1d. That is, the depletion layer 21 formed in the first semiconductor layer 5 reduces the diameter W of the second hole 9 in one side by the width 1d, thus forming the diameter w of the heating spot 15a. The diameter w of the heating spot 15a is given by equation (2).

$$w = W - 1d \qquad (2)$$

In the above, W designates the width or diameter of the second hole 9, and 1d designates the width of the depletion layer 21 in the first semiconductor layer 5.

Since the width W of the second hole 9 is defined by the process limit, it is possible to control the width W by controlling process conditions. In addition, it is possible to control the width 1d of the depletion layer 21 in the first semiconductor layer 5 by controlling the density of impurities doped into the first semiconductor layer 5 and the doping condition in manufacturing.

As described above, it is possible to control the diameter of the heating spot 15a by controlling the sizes of the second hole 9 and the depletion layer 21.

As shown in FIG. 3B, both the heater plug 15 and the depletion layer 21 are formed in an elliptic shape in plan view, wherein they are positioned in one side (i.e. in proximity to the interior surface 4c) of the first hole 4. The second semiconductor layer 6 is formed to surround the heater plug 15 and the depletion layer 21 in the first hole 4 in plan view. The second semiconductor layer 6 is surrounded by the first interlayer insulating film 3.

The heater plug 15 having an elliptic shape has a short diameter w and a long diameter x. Similar to the short diameter w, the long diameter x of the heater plug 15 is reduced by the depletion layer 21. That is, it is possible to reduce the long diameter x of the heater plug 15 to be smaller than the diameter W of the second hole 9 defined by the process limit. The cross section of the heater plug 15 is identical to that of the heating spot 15a; hence, the diameter of the heater plug 15 is identical to the diameter of the heating spot 15a.

As described above, it is possible to form the second hole 9 in an elliptic shape and to position the second hole 9 in one side of the first hole 4 in plan view.

Due to the formation of the depletion layer 21, it is possible to reduce the diameter of the heater plug 15 in one side, thus reducing the diameter of the heating spot 15a.

When the current 13 is applied in the direction from the lower electrode 2 to the upper electrode 11 via the heater plug 15, the heating spot 15a heats the phase-change recording layer 10 with the current 13, thus writing data into the phase-change recording layer 10.

Since the area of the heating spot 15a is proportional to the current value Ireset which flows through the heater plug 15 so as to heat the phase-change recording layer 10, the diameter of the heating spot 15a becomes proportional to the current value Ireset; hence, it is possible to reduce the diameter of the heating spot 15a. Since the diameter of the heating spot 15a becomes smaller than the diameter W of the second hole 9 defined by the process limit, it is possible to reduce the current value Ireset (used for writing data into the phase-change recording layer 10). This increases the scale of storage of the phase-change nonvolatile memory 71 while reducing the power consumption.

Since the second hole 9 is formed in one side of the first hole 4 in plan view so that the position of the second hole 9 matches the circumferential periphery of the first hole 4, it is possible to simplify the manufacturing process, thus improving the productivity.

Since the phase-change nonvolatile memory 71 of the second embodiment is designed such that the second hole 9 is positioned in one side of the first hole 4 in plan view, it is possible to simplify the manufacturing process, thus improving the productivity; hence, it is possible to produce semiconductor devices using the phase-change nonvolatile memory 71 with high productivity.

3. THIRD EMBODIMENT

Next, a phase-change nonvolatile memory 72 according to a third embodiment of the present invention will be described with reference to FIGS. 4 and 5, wherein parts identical to those shown in FIGS. 1, 2A, and 2B are designated by the same reference numerals. Specifically, FIG. 4 shows the constitution of the phase-change nonvolatile memory 72 not including the depletion layer 21, and FIG. 5 shows the constitution of the phase-change nonvolatile memory 72 including the depletion layer 21.

Figure 4:
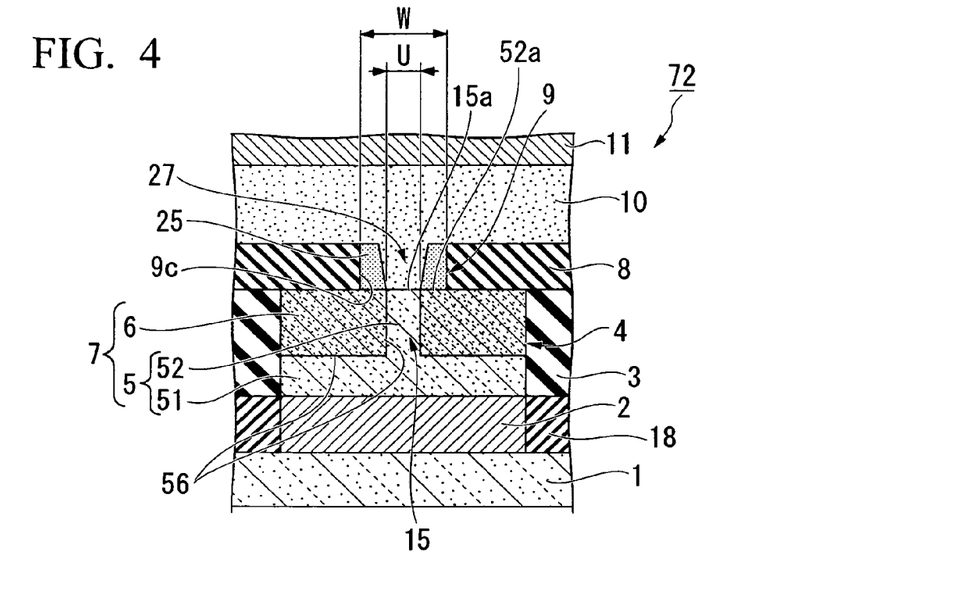
FIG. 4 is a cross-sectional view showing the constitution of a phase-change nonvolatile memory in accordance with a third embodiment of the present invention.
Figure 5:
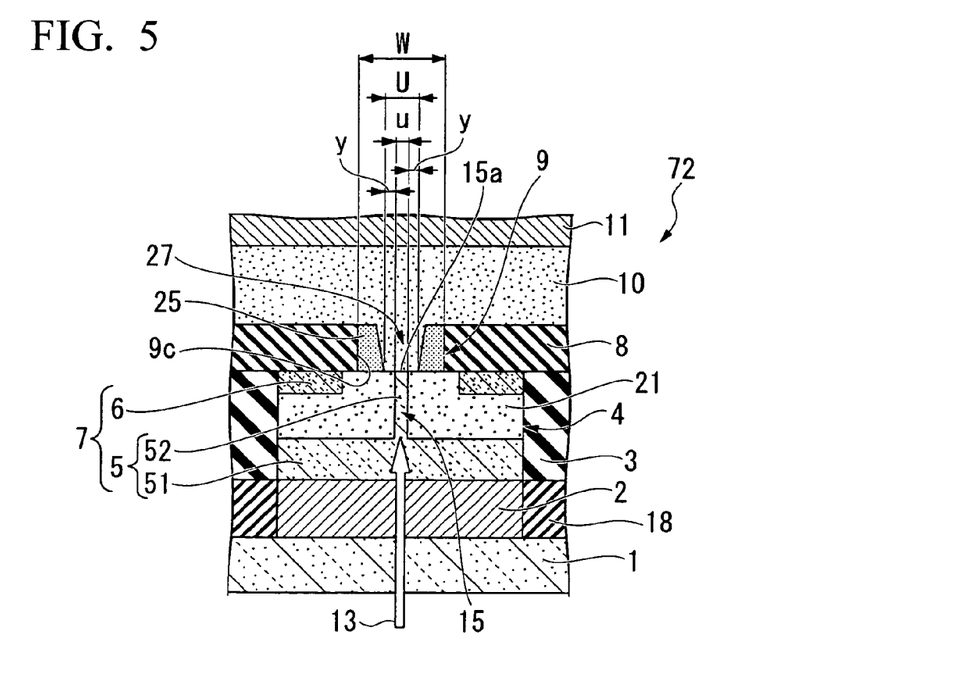
FIG. 5 is a cross-sectional view showing the constitution of the phase-change nonvolatile memory including the depletion layer.

As shown in FIG. 4, the constitution of the phase-change nonvolatile memory 72 of the third embodiment is basically identical to the constitution of the phase-change nonvolatile memory 70 of the first embodiment except that a side wall 25 is formed on the interior surface 9c of the second hole 9.

The side wall 25 is formed along the interior surface 9c of the second hole 9 so as to form a third hole 27. The third hole 27 is shaped in such a way that a diameter U thereof associated with the impurity diffusion layer 7 is gradually increased in an upward direction. In this connection the diameter U of the third hole 27 is smaller than the diameter W of the second hole 9; hence, U<W.

In the process for changing the conductivity type of the projecting portion 52 of the first semiconductor layer 5 (included in the impurity diffusion layer 7) by way of double injection, the side wall 25 serves as a mask for partially covering the upper surface 52a of the projecting portion 52, thus making the second semiconductor layer 6, which is protected by the mask, remain. As a result, the diameter of the heating spot 15a is changed from the diameter W defined by the process limit to the diameter U of the third hole 27 which is reduced by the side wall 25.

FIG. 5 is a cross-sectional view showing the constitution of the phase-change nonvolatile memory 72 including the depletion layer 21, which is formed to partially cut into the projecting portion 52, thus reducing the diameter of the heater plug 15.

The depletion layer 21 is formed in an L-shape or a reverse L-shape in cross section. The depletion layer 21 is formed to partially cut into the first semiconductor layer 5 and the second semiconductor layer 6 from the joint surface 56. Specifically, the depletion layer 21 is formed in the first semiconductor layer 5 with a width y from the joint surface 56. That is, the depletion layer 21 formed in the first semiconductor layer 5 further reduces the diameter U of the third hole 27, which is reduced by the side wall 25, with the width y on both sides, thus forming the heating spot 15a having a diameter u. The diameter u of the heating spot 15a is given by equation (3).

$$u = U - 2xy \quad (3)$$

The width (or diameter) U of the third hole 27 is defined by the process limit regarding the formation of holes and the process limit regarding the formation of the side wall 25; hence, it is possible to control the width U of the third hole 27 by controlling process conditions. It is possible to control the width y of the depletion layer 21 formed in the first semiconductor layer 5 by controlling the density of impurities doped in the first semiconductor layer 5 and the doping condition in manufacturing.

That is, it is possible to control the diameter u of the heating spot 15a by controlling the sizes of the third hole 27 and the deletion layer 21.

When the current 13 flows in the direction from the lower electrode 2 to the upper electrode 11 via the heater plug 15, the heating spot 15a heats the phase-change recording layer 10 by the current 13, thus writing data into the phase-change recording layer 10.

Since the area of the heating spot 15a is proportional to the current value Ireset which flows through the heater plug 15 so as to heat the phase-change recording layer 10, the diameter u of the heating spot 15a becomes proportional to the current value Ireset; this makes it possible to reduce the diameter u of the heating spot 15a. Since the diameter u of the heating spot 15a decreases to be lower than the diameter U of the third hole 27 defined by the process limit, it is possible to reduce the current value Ireset (for writing data into the phase-change recording layer 10).

In short, it is possible to achieve a large scale of storage using the phase-change nonvolatile memory 72 while reducing the power consumption.

Since the phase-change nonvolatile memory 72 of the third embodiment is designed so that the diameter of the upper surface 52a of the projecting portion 52 is reduced from W to U in advance by way of the formation of the side wall 25, it is possible to reduce the diameter of the heater plug 15, thus reducing the diameter u of the heating spot 15a; in other words, it is possible to reduce the current value Ireset.

4. FIRST MANUFACTURING METHOD

Next, a first manufacturing method of the phase-change nonvolatile memory (PRAM) of the present invention will be described with reference to FIGS. 6A, 6B, 7A, 7B, and 8, which show the formation of the above films and layers on the semiconductor substrate 1.

The first manufacturing method of the phase-change nonvolatile memory of the present invention includes a lower electrode forming process, a first hole forming process, an impurity diffusion layer forming process, a second hole forming process, a conductivity type changing process, a phase-change recording layer forming process, and an upper electrode forming process.

Since the phase-change nonvolatile memory of the present invention is constituted of MOS transistors and storage elements formed on the substrate 1, a substrate forming process (forming MOS transistors on the substrate 1) will be described before describing the above processes.

(1) Substrate Forming Process

First, an interlayer insulating film 18 is formed on the surface 1a of the substrate 1. It is possible to use silicon oxide (SiO$_2$) as the material of the interlayer insulating film 18 (used for forming a MOS transistor).

A source/drain region 17 (used as a part of the MOS transistor) is formed in the substrate 1 in advance.

Next, a hole 19 having a diameter D is formed by way of lithography (which is a well-known technology), thus exposing a part of a surface 17a of the source/drain region 17.

(2) Lower Electrode Forming Process

Figure 6A:
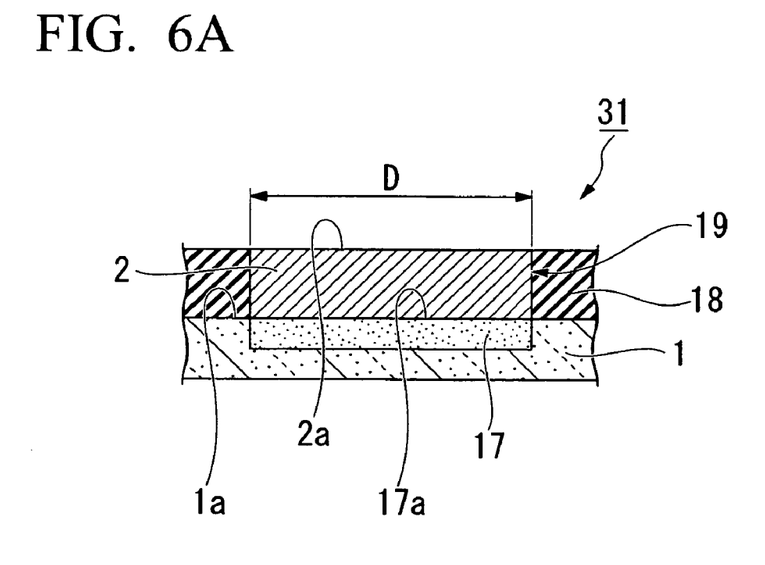
FIG. 6A is a cross-sectional view showing the fabrication of a lower-electrode fabricated substrate.

As shown in FIG. 6A, the lower electrode 2 is formed and embedded in the hole 19; then, a surface 2a of the lower electrode 2 is subjected to planation, thus completing the fabrication of a lower electrode fabricated substrate 31.

As the material of the lower electrode 2, it is possible to use titanium nitride (TiN) and the like. The planation is performed by way of CMP (Chemical Mechanical Polishing) and the like.

It is possible to form a contact plug between the lower electrode 2 and the source/drain region 17.

(3) First Hole Forming Process

Figure 6B:
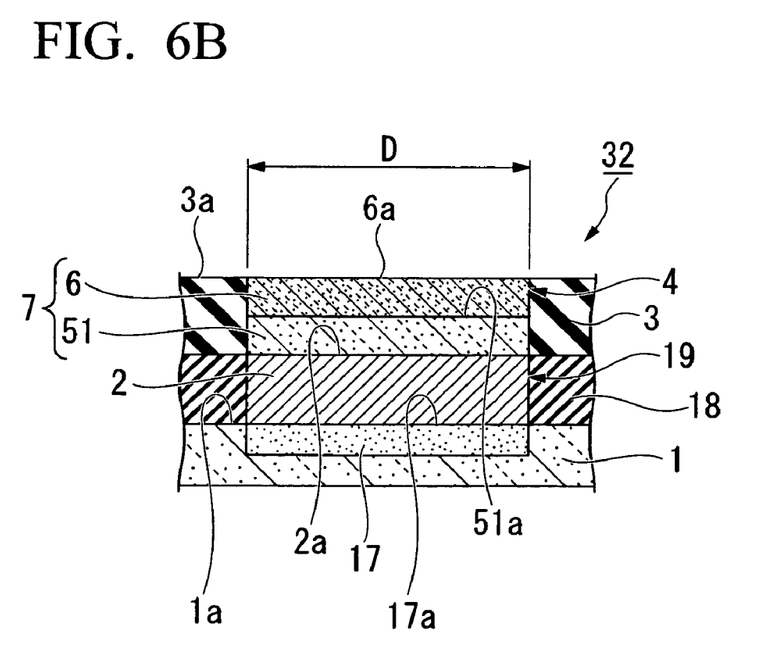
FIG. 6B is a cross-sectional view showing the fabrication of an impurity-diffusion-layer fabricated substrate.

As shown in FIG. 6B, the first interlayer insulating film 3 is formed to cover the surface 2a of the lower electrode 2 and a surface 18a of the interlayer insulating film 18. As the material of the first interlayer insulating film 3, it is possible to use silicon oxide (SiO$_2$) and the like. The thickness of the first insulating film 3 is set to approximately 100 nm, for example.

Next, the first hole 4 running through the first interlayer insulating film 3 is formed so as to expose the surface 2a of the lower electrode 2. The diameter of the first hole 4 is identical to the diameter D of the hole 19, wherein the circumferential periphery of the first hole 4 matches the circumferential periphery of the hole 19 in position. The diameter D of the first hole 4 is set to approximately 200 nm, for example.

(4) Impurity Diffusion Layer Forming Process

Next, the impurity diffusion layer 7 constituted of the base portion 51 and the second semiconductor layer 6 is formed in such a way that the base portion 51 is formed inside the first hole 4. The height of the base portion 51 is approximately a half of the depth of the first hole 4. For example, the thickness of the base portion 51 is set to approximately 50 nm.

The base portion 51 constituted of an N-type semiconductor is formed by injecting N-type impurities such as phosphorus (P) into a monocrystal semiconductor (composed of Si) or a compound semiconductor (composed of GaAs). The density of impurities injected into the base portion 51 is approximately $3 \times 10^{17}$ cm$^{-3}$.

In one method for forming the base portion 51 inside the first hole 4, a deposition mask is used to form the base portion 51 inside the first hole 4. In another method, the base portion 51 is formed to cover the first interlayer insulating film 3 and to embed the first hole 4; then, dry etching is performed on the entire surface while leaving the base portion 51 only in a bottom 4b of the first hole 4, thus forming the base portion 51 inside the first hole 4.

Next, the second semiconductor layer 6 is formed on a surface 51a of the base portion 51.

The height of the second semiconductor layer 6 is approximately a half of the depth of the first hole 4, wherein a surface 6a of the second semiconductor layer 6 matches the surface 3a of the interlayer insulating film 3 in position. For example, the thickness of the second semiconductor layer 6 is approximately 50 nm.

The second semiconductor layer 6 composed of a P-type semiconductor is formed by injecting P-type impurities such as boron (B) into a semiconductor. The density of impurities injected into the second semiconductor layer 6 is approximately $1 \times 10^{20}$ cm$^{-3}$. The impurity diffusion layer 3 is formed with the above conditions and dimensions.

Thereafter, as shown in FIG. 6B, the surface 6a of the second semiconductor layer 6 is subjected to planation by way of CMP, thus completing the fabrication of an impurity-diffusion-layer fabricated substrate 32.

(5) Second Hole Forming Process

Figure 7A:
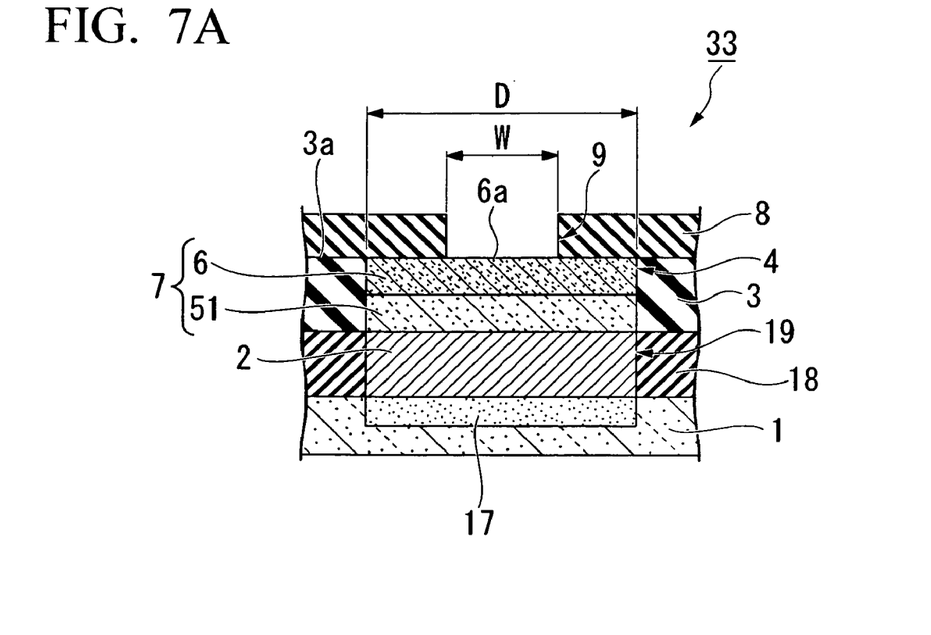
FIG. 7A is a cross-sectional view showing the fabrication of a hole-fabricated substrate.

The second interlayer insulating film 8 is formed to cover the surface 3a of the first interlayer insulating film 3 and the surface 6a of the second semiconductor layer 6. As the material of the second interlayer insulating film 8, it is possible to use silicon oxide (SiO$_2$). The thickness of the second interlayer insulating film 8 is set to approximately 70 nm.

Next, as shown in FIG. 7A, the second hole 9 is formed in the second interlayer insulating film 8 by way of lithography. The diameter W of the second hole 9 is smaller than the diameter D of the first hole 4 (where W<D), wherein the second hole 9 is positioned approximately in the center area of the first hole 4 in plan view. The diameter W of the second hole 9 is set to approximately 160 nm. This completes the fabrication of a hole-fabricated substrate 33.

(6) Conductivity Type Changing Process

Figure 7B:
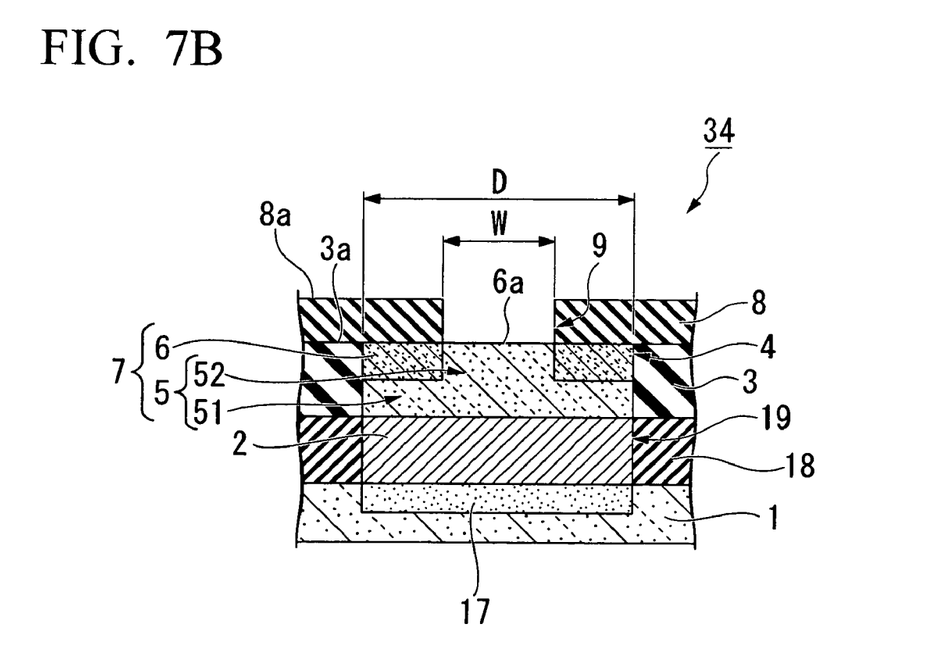
FIG. 7B is a cross-sectional view showing the fabrication of a conductivity-type changed substrate.

As shown in FIG. 7B, impurities having a different conductivity type are injected into the surface 6a of the second semiconductor layer 6 from the surface 8a of the second interlayer insulating film 8 via the second hole 9, thus changing a prescribed part of the second semiconductor layer 6 into a part of the first semiconductor layer 5. The prescribed part of the second semiconductor layer 6, which is changed in the conductivity type, forms the projecting portion 52 of the first semiconductor layer 5. The density of impurities injected into the projecting portion 52 is set to approximately $3 \times 10^{17}$ cm$^{-3}$.

The size and position of the projecting portion 52 are identical to those of the second hole 9 in plan view.

For example, N-type impurities such as phosphorus (P) are injected into the second semiconductor layer 6 composed of a P-type semiconductor so that a part of the P-type semiconductor is changed in conductivity type to an N-type semiconductor.

The above method is known as "double injection" in which, after injection of P-type or N-type impurities, impurities of a different conductivity type are injected into the semiconductor substrate 1.

By controlling conditions for injecting impurities of the different conductivity type, it is possible to increase the height of the projecting portion 52 to be larger than the height of the second semiconductor layer 6. This prevents a part of the second semiconductor layer 6 from existing (or remaining) between the base portion 51 and the (newly formed) projecting portion 52, whereby it is possible to completely form the first semiconductor layer 5 integrally constituted of the base portion 51 and the projecting portion 52. This completes the fabrication of a conductivity-type changed substrate 34.

(7) Phase-Change Recording Layer Forming Process

Figure 8:
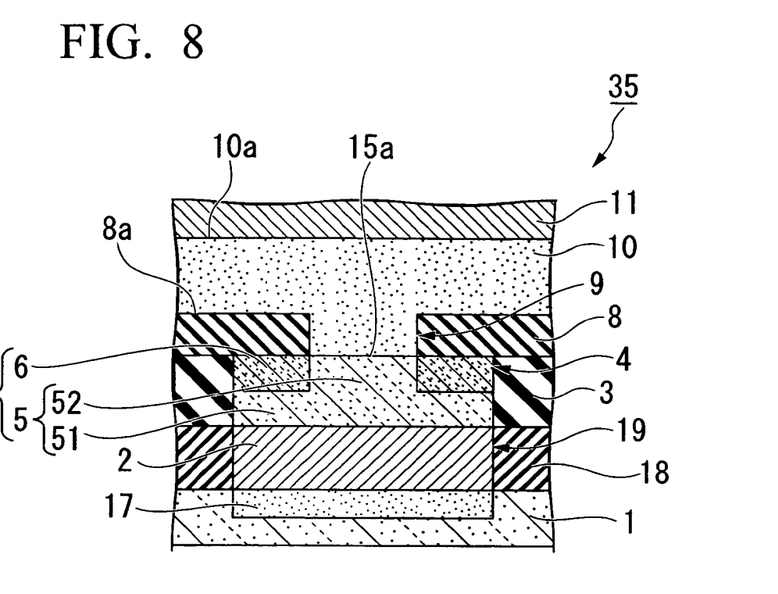
FIG. 8 is a cross-sectional view showing the complete fabrication of the phase-change nonvolatile memory having a storage element.

As shown in FIG. 8, the phase-change recording layer 10 is formed to cover the surface 8a of the second interlayer insulating film 8 and to embed the second hole 9.

As the recording material for use in the phase-change recording layer 10, it is preferable to use the above chalcogenide material such as GeSbTe. Because, the chalcogenide material can provide stability and maintain the phase change occurring in the phase-change recording layer 10. The recording material is not necessarily limited to the chalcogenide material; hence it is possible to use other materials whose resistances can be varied upon heating caused by electric currents.

(8) Upper Electrode Forming Process

Next, as shown in FIG. 8, the upper electrode 11 is formed on a surface 10a of the phase-change recording layer 10, thus completing the fabrication of a storage element 35 incorporated in the phase-change nonvolatile memory. As the material of the upper electrode 11, it is preferable to use titanium nitride (TiN) and the like.

According to the first manufacturing method of the phase-change nonvolatile memory, impurities of a different conductivity type are injected into the surface 6a of the second semiconductor layer 6 via the second hole 9 so as to change the prescribed part of the second semiconductor layer 6 in conductivity type, thus forming the projecting portion 52, which is then combined with the base portion 51 so as to completely and integrally form the first semiconductor layer 5. This makes it possible to form the first semiconductor layer 5 in conformity with the shape and position of the second hole 9 in plan view. That is, it is possible to precisely control the position and size of the junction surface 56 as well as the position and size of the depletion layer 21 (which is formed in proximity to the junction surface 56), whereby it is possible to appropriately reduce the diameter of the heating spot 15a by use of the depletion layer 21.

Since the first manufacturing method of the phase-change nonvolatile memory is designed to reduce the diameter of the heating spot 15a by controlling the position and size of the depletion layer 21 formed in proximity to the junction surface 56, it is possible to control the diameter of the heating spot 15a with high precision and to thereby precisely reduce the diameter of the heating spot 15a, whereby it is possible to reduce the current value Ireset.

Since the first manufacturing method of the phase-change nonvolatile memory is designed to use the double injection in which impurities of a different conductivity type are injected into the surface 6a of the second semiconductor layer 6 so as to form the projecting portion 52 by use of the prescribed part of the second semiconductor layer 6 (whose conductivity type is changed due to injection), it is possible to easily transform the prescribed part of the second semiconductor layer 6 into the projecting portion 52, thus improving the productivity.

5. SECOND MANUFACTURING METHOD

Next, a second manufacturing method adapted to the phase-change nonvolatile memory of the present invention will be described below.

Similar to the first manufacturing method, the second manufacturing method performs the substrate forming process, the lower electrode forming process, the first hole forming process, the impurity diffusion layer forming process, and the second hole forming process.

After completion of the second hole forming process in which the second hole 9 is formed in the second interlayer insulating film 8, an oxide film is formed to cover the second interlayer insulating film 8 and to embed the second hole 9. The oxide film can be formed by way of CVD, for example.

Next, the oxide film is subjected to etching back so as to form a side wall on the interior surface 9c of the second hole 9, thus forming a third hole whose diameter is smaller than the diameter of the second hole 9.

Next, a conductivity type changing process is performed in such a way that only a certain portion of the first semiconductor layer 5 exposed in the third hole is used to form the projecting portion 52. Thereafter, the phase-change nonvolatile memory is completely produced in a similar manner to the first manufacturing method.

A diameter of a channel of the phase-change nonvolatile memory is defined by further reducing the diameter of the third hole by use of the depletion layer 21.

Since the second manufacturing method is characterized in that the third hole whose diameter is smaller than the diameter of the second hole is formed by way of the side wall formed on the interior surface 9c of the second hole 9, a part of the first semiconductor layer 5 is reshaped to form the projecting portion 52 in conformity with the shape of the third hole, whereby the phase-change nonvolatile memory is produced in such a way that the diameter of the heater plug 15 is further reduced by use of the size of the depletion layer formed in proximity to the junction surface 56. This makes it possible to further reduce the current value Ireset for writing data into the phase-change recording layer.

6. ACTUAL PRODUCTION OF PHASE-CHANGE NONVOLATILE MEMORY

Figure 11:
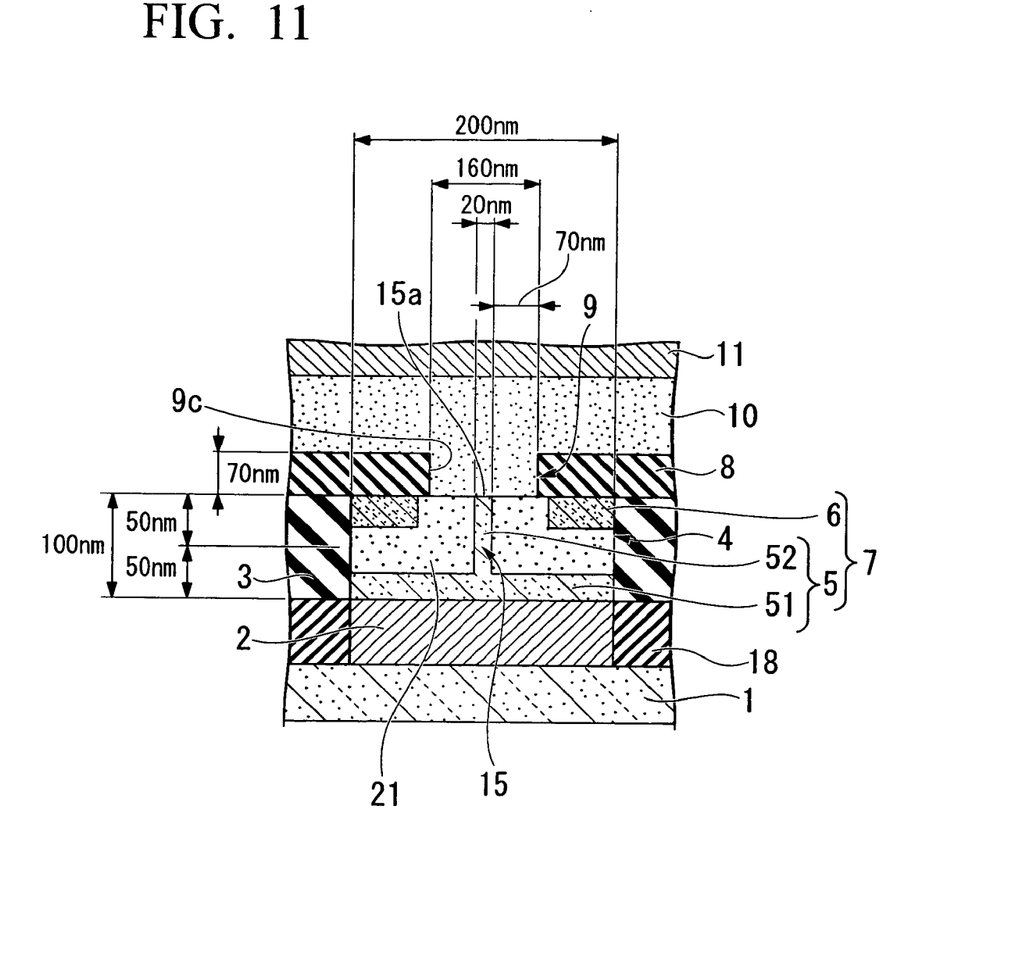
FIG. 11 is a cross-sectional view showing a product of the phase-change nonvolatile memory, which is actually produced in accordance with the first manufacturing method.

Next, an actually manufactured product of the phase-change nonvolatile memory shown in FIG. 11 will be described below, although it is illustrative and not restrictive.

(1) Substrate Forming Process

First, the interlayer insulating film 18 composed of silicon oxide ($SiO_2$) is formed on the surface 1a of the semiconductor substrate 1; then, the hole 19 is formed in the semiconductor substrate 1.

(2) Lower Electrode Forming Process

The lower electrode 2 composed of titanium nitride (TiN) is formed to embed the hole 19; then, the surface 2a of the lower electrode 2 is subjected to planation by way of CMP.

(3) First Hole Forming Process

The first interlayer insulating film 3 composed of silicon oxide ($SiO_2$) is formed on the lower electrode 2.

Next, the first hole 4 is formed by way of lithography, thus exposing the surface 2a of the lower electrode 2. The diameter and position of the first hole 4 are identical to those of the hole 19, wherein the diameter is set to 200 nm.

(3) Impurity Diffusion Layer Forming Process

Impurities of phosphorus (P) are injected into the first hole 4 at the density of impurities of $3\times10^{17}$ $cm^{-3}$ so as to form the base 51 composed of a monocrystal semiconductor composed of silicon (Si) with 50 nm thickness.

Next, impurities of boron (B) are injected onto the surface 51a of the base 51 at the density of impurities of $1\times10^{20}$ $cm^{-3}$ so as to form the second semiconductor layer 6 configured of a P-type semiconductor, i.e. a monocrystal semiconductor composed of silicon (Si), with 50 nm thickness.

Thereafter, the surface 6a of the P-type second semiconductor layer 6 is subjected to planation by way of CMP.

(4) Second Hole Forming Process

The second interlayer insulating film 8 composed of silicon oxide ($SiO_2$) is formed on the surface 3a of the first interlayer insulating film 3 with 70 nm thickness.

Next, the second hole 9 whose diameter is 160 nm is formed in the second interlayer insulating film 8 by way of lithography, wherein the second hole 9 is positioned approximately at the center of the first hole 4.

(5) Conductivity Type Changing Process

Impurities of phosphorus (P) are injected to the exposed surface of the P-type second semiconductor layer 6 from the second interlayer insulating film 8 via the second hole 9 at the density of impurities of $3\times10^{17}$ $cm^{-3}$, thus forming the projecting portion 52. This makes it possible to completely form the N-type first semiconductor layer 5 constituted of the base portion 51 and the projecting portion 52.

(6) Phase-Change Recording Layer Forming Process

The phase-change recording layer composed of GeSbTe is formed to cover the surface 8a of the second interlayer insulating film 8 and to embed the second hole 9.

(7) Upper Electrode Forming Process

The upper electrode 11 composed of titanium nitride (TiN) is formed on the surface 10a of the phase-change recording layer 10, thus completely forming the storage element of the phase-change nonvolatile memory.

When a current source (not shown) is used to apply a current to the storage element of the phase-change nonvolatile memory which is actually produced by way of the above processes, it is confirmed that the current actually flows between the lower electrode 2 and the upper electrode 11. The current value actually proves that the diameter of the heating sport 15a is 20 nm, and depletion layer 21 is formed to partially cut into the N-type first semiconductor layer 5 by 70 nm from the interior surface 9c of the second hole 9. Due to the foregoing process limit adapted to the phase-change nonvolatile memory, the diameter of the heating sport 15a cannot be reduced below the limit of 30 nm, whereas the present invention proves that the diameter of the heating spot 15a can be further reduced below the process limit in actuality.

7. INDUSTRIAL APPLICABILITY

The present invention is designed to reduce the current value Ireset in the phase-change nonvolatile memory (PRAM) and is applicable to any types of semiconductor devices using memories having large capacities of storage and low power consumption.

Lastly, it is apparent that the present invention is not limited to the above embodiments, but may be modified and changed without departing from the scope and spirit of the invention.

What is claimed is:
1. A phase-change nonvolatile memory comprising:
a semiconductor substrate;
a lower electrode formed on the semiconductor substrate;
a first interlayer insulating film which is formed to cover the lower electrode and the semiconductor substrate, wherein a first hole is formed in the first insulating film so as to expose the lower electrode;

an impurity diffusion layer embedded in the first hole, wherein the impurity diffusion layer is constituted of a first semiconductor layer and a second semiconductor layer which have different conductivity types;

a second interlayer insulating film which is formed to cover the first interlayer insulating film and the impurity diffusion layer, wherein a second hole is formed in the second interlayer insulating film so as to expose the impurity diffusion layer;

a phase-change recording layer which is formed to cover the second interlayer insulating film and to embed the second hole; and an upper electrode formed on the phase-change recording layer, wherein the first semiconductor layer is constituted of a base portion which is formed inside the first hole so as to cover the lower electrode and a projecting portion which projects from the base portion so that a heating spot thereof comes in contact with the phase-change recording layer in the second hole, while the second semiconductor layer is formed to at least partially surround the projecting portion, wherein a depletion layer is formed in proximity to a junction surface formed between the first semiconductor layer and the second semiconductor layer so as to reduce a diameter of the heating spot, and wherein the heating spot heats the phase-change recording layer in response to a current flowing between the impurity diffusion layer and the phase-change recording layer.

2. The phase-change nonvolatile memory according to claim 1, wherein the second hole is positioned inside the first hole in plan view.

3. The phase-change nonvolatile memory according to claim 1, wherein a side wall is formed on an interior surface of the second hole.

4. A phase-change nonvolatile memory comprising:
a lower electrode:
a semiconductor layer disposed on the lower electrode;
a phase-change recording layer disposed on the semiconductor layer; and
an upper electrode disposed on the phase-change recording layer,
wherein the semiconductor layer comprises a first impurity diffusion layer and a second impurity diffusion layer having different conductivity types from each other,
and a heating current for the phase-change recording layer is controlled by a width of a depletion layer formed at a PN junction surface of the first impurity diffusion layer and the second impurity diffusion layer.

5. The phase-change nonvolatile memory according to claim 4, wherein a part of the first impurity diffusion layer is at least partially surrounded by the second impurity diffusion layer, and the phase-change recording layer is in contact with a surface of the part of the first impurity diffusion layer.

6. The phase-change nonvolatile memory according to claim 5 further comprising a first insulating film, wherein the semiconductor layer is formed in a first hole located in the first insulating film.

7. The phase-change nonvolatile memory according to claim 6 further comprising a second insulating film disposed on the first insulating film, wherein the phase-change recording layer is formed in a second hole located in the second insulating film, and the second hole is positioned inside the first hole in plan view.

8. The phase-change nonvolatile memory according to claim 4, wherein a thermal conductivity of the lower electrode is higher than a thermal conductivity of the upper electrode.

9. The phase-change nonvolatile memory according to claim 4, wherein the semiconductor layer comprises a silicon layer, and the phase-change recording layer comprises a chalcogenide layer.

10. A phase-change nonvolatile memory comprising:
a lower electrode;
a first impurity diffusion layer of a first conductivity type, the first impurity diffusion layer including a base portion on the lower electrode and a projecting portion projected from a first top surface portion of the base portion;
a second impurity diffusion layer of a second conductivity type formed on a second top surface portion of the base portion and a side surface of the projecting portion, the first conductivity type being different from the second conductivity type; and
a phase-change recording layer formed on a top surface of the projecting portion.

11. The phase-change nonvolatile memory according to claim 10, wherein a first hole is formed in the second impurity diffusion layer so as to expose the lower electrode and a second hole is formed above the first hole to expose the projecting portion, and
wherein the second hole is positioned inside the first hole in plan view.

12. The phase-change nonvolatile memory according to claim 10, wherein a first hole is formed in the second impurity diffusion layer so as to expose the lower electrode and a second hole is formed above the first hole to expose the projecting portion, and
wherein a part of an interior surface of the second hole contacts with an interior surface of the first hole.

13. The phase-change nonvolatile memory according to claim 10, wherein a first hole is formed in the second impurity diffusion layer so as to expose the lower electrode and a second hole is formed above the first hole to expose the projecting portion, and
wherein the second hole is positioned on one side of the first hole in plan view.

14. The phase-change nonvolatile memory according to claim 10, wherein a first hole is formed in the second impurity diffusion layer so as to expose the lower electrode and a second hole is formed above the first hole to expose the projecting portion, and
wherein the second hole has an elliptic shape.

15. The phase-change nonvolatile memory according to claim 10, wherein a first hole is formed in the second impurity diffusion layer so as to expose the lower electrode and a second hole is formed above the first hole to expose the projecting portion, and
wherein, in a plan view, a position of the second hole matches a circumferential periphery of the first hole.

16. The phase-change nonvolatile memory according to claim 10, wherein a first hole is formed in the second impurity diffusion layer so as to expose the lower electrode and a second hole is formed above the first hole to expose the projecting portion, and
wherein a side wall is formed on an interior surface of the second hole.

17. The phase-change nonvolatile memory according to claim 16, wherein a third hole is formed by the side wall such that the third hole has a diameter associated which increases in a direction toward said phase-change recording layer.

18. The phase-change nonvolatile memory according to claim 17, wherein a diameter of the third hole is smaller than a diameter of the second hole.

* * * * *